United States Patent [19]

Lee et al.

[11] Patent Number: 5,508,564
[45] Date of Patent: Apr. 16, 1996

[54] SEMICONDUCTOR DEVICE HAVING AN IMPROVED PACKING DENSITY AND HIGH RELIABILITY

[75] Inventors: Kyu-pil Lee; Yong-jik Park, both of Kyunggi-do, Rep. of Korea

[73] Assignee: Samsung Electronics Co., Ltd., Suwon, Rep. of Korea

[21] Appl. No.: 307,040

[22] Filed: Sep. 16, 1994

Related U.S. Application Data

[63] Continuation of Ser. No. 132,236, Oct. 6, 1993, abandoned, which is a continuation of Ser. No. 857,451, Mar. 25, 1992, abandoned.

[30] Foreign Application Priority Data

Oct. 21, 1991 [KR] Rep. of Korea ............... 91-18520

[51] Int. Cl.⁶ ................ H01L 29/76; H01L 23/48; H01L 23/52
[52] U.S. Cl. ............... 257/774; 257/382; 257/401; 257/773
[58] Field of Search ............... 357/68; 257/773, 257/401, 382, 774

[56] References Cited

U.S. PATENT DOCUMENTS

| | | | |
|---|---|---|---|
| 4,603,341 | 7/1986 | Bertin et al. | 357/23.7 |
| 4,839,705 | 6/1989 | Tigelaar et al. | 357/23.5 |
| 4,994,893 | 2/1991 | Ozaki et al. | 357/68 |
| 5,057,899 | 10/1991 | Samata et al. | 357/68 |
| 5,061,985 | 10/1991 | Meguro et al. | 357/68 |
| 5,072,282 | 12/1991 | Takagi et al. | 357/71 |
| 5,083,188 | 1/1992 | Yamagata | 357/71 |
| 5,103,285 | 4/1992 | Furumura et al. | 357/68 |

*Primary Examiner*—Rolf Hille
*Assistant Examiner*—Valencia Martin Wallace
*Attorney, Agent, or Firm*—Cushman Darby & Cushman

[57] ABSTRACT

A semiconductor device is fabricated having contact holes formed in an interlayer insulator and on impurity diffusion regions positioned on either side of an isolator. The contact holes are arranged so as not to be disposed along a shortest line path across the isolator. This arrangement isolating interval and provides a structure which can realize higher packing density and improved reliability.

16 Claims, 5 Drawing Sheets

FIG. IA
(PRIOR ART)
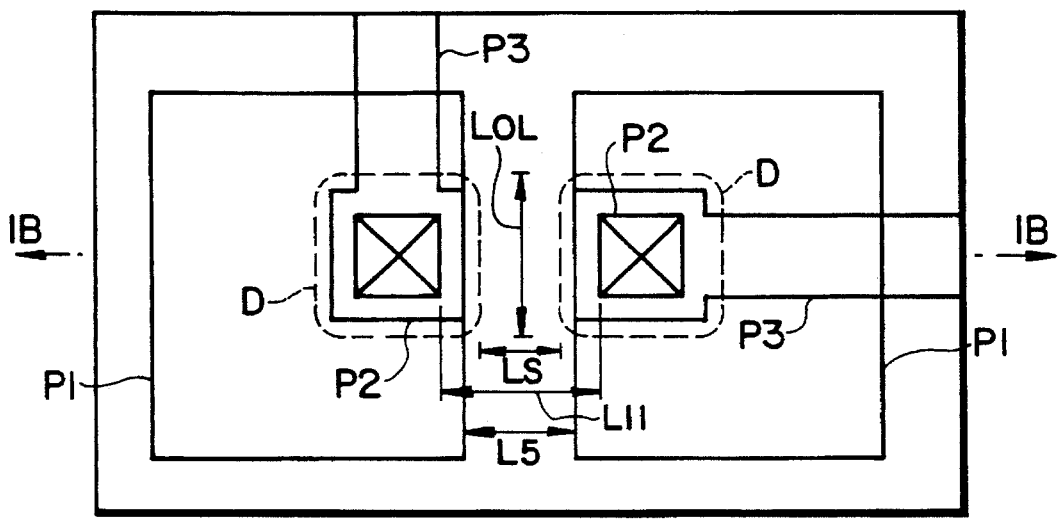
FIG. IB
(PRIOR ART)
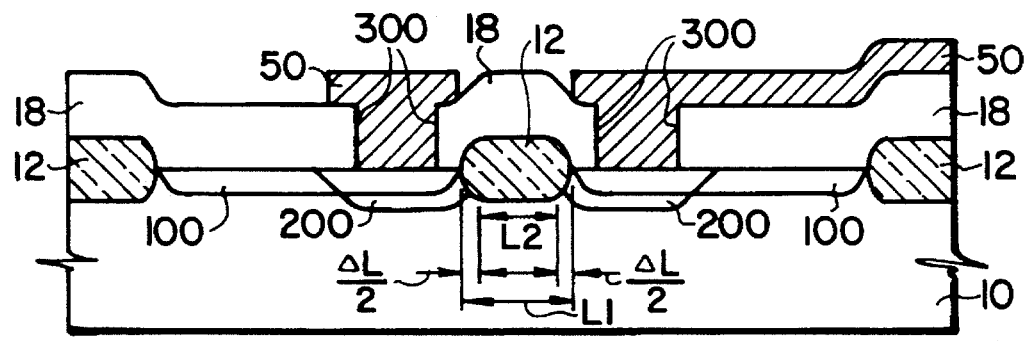

SEMICONDUCTOR DEVICE HAVING AN IMPROVED PACKING DENSITY AND HIGH RELIABILITY

This is a continuation of application Ser. No. 08/132,236, filed on Oct. 6, 1993, which was abandoned upon the filing hereof 07/857,451 filed Mar. 25, 1992 which was abandoned.

BACKGROUND OF THE INVENTION

1. Field of the Invention

The present invention relates to a semiconductor device in which there is formed a contact hole in a manner resulting in a structure having an improved packing density and high reliability.

2. Description of the Prior Art

As semiconductor devices become miniaturized increasing from 0.5 µm to a 0.3 µm packing density level, new and unanticipated problems must be overcome in the manufacturing of these devices. Such problems include dealing with unexpected physical properties of higher density semiconductor circuits and limitations posed by existing processing methods and manufacturing equipment and facilities.

Increased packing density is particularly a cause of reduced reliability in connection with fabrication of MOS transistors. The reduction of channel length and the size of the field oxide layer regions contribute to both a short-channel effect and the well known punch-through phenomenon thereby imposing limits in the manufacturing of high density semiconductor devices.

FIG. 1A shows a layout of a semiconductor device which illustrates a conventional method for forming a contact hole in a semiconductor device.

FIG. 1B shows a cross-section of the semiconductor device of FIG. 1A cut along line AA. In FIG. 1A, mask pattern P1 rectangular regions are horizontally symmetrical and form a field oxide layer to divide a semiconductor substrate into an active region and a device isolating region. Mask pattern P2 square regions which exist inside mask pattern P1 and have two crossing oblique lines form a contact hole which interconnects a conductive layer to an impurity diffusion region. Mask pattern P3 regions which include mask pattern P2 and are shown extending in different directions form a conductive layer. $L_5$ represents the narrowest width of a field oxide layer, $L_s$ represents the shortest distance between the second impurity diffusion regions, $L_{11}$ represents the shortest distance between the contact holes, D represents a second impurity region and $L_{OL}$ represents the width of a portion which is overlapped when the second impurity diffusion regions are horizontally extended.

FIG. 1B illustrates a semiconductor device which comprises a field oxide layer 12 for dividing a semiconductor substrate 10 of a first conductivity type into a device isolating region and an active region, a first impurity diffusion region 100 of a second conductivity which is formed in the active region, a second impurity diffusion region 200 of a second conductivity which is formed in the first impurity diffusion region, an interlayer insulator 1B which isolates the substrate 10 from a conductive layer 50, a contact hole 300 formed in the interlayer insulator 18 for electrically connecting conductive layer 50 to second impurity diffusion region 200, and conductive layer 50.

The second impurity diffusion region 200 of a second conductivity is formed so as to both reduce contact resistance between the conductive layer 50 and substrate 10 and to prevent operation failure of the device by etching deeper than the depth of the first impurity diffusion region 100 due to the overetching of the substrate during the dry etching for forming the contact hole. Usually, the impurity concentration of the second impurity diffusion region 200 is higher than that of the first impurity diffusion region 100, and the junction depth of the second impurity diffusion region 200 is deeper than that of the first impurity diffusion region 100 (junction depth is the depth of an impurity diffusion region from the surface of a substrate).

The second impurity diffusion region which is formed of impurity ions doped through the contact hole is spread laterally by thermal energy supplied to the substrate during a process of doping the impurity ions or during other subsequent processes, which reduces the effective iHxlating interval of the device isolating region and results in short-channel effect and punch-through.

In FIG. 1B, the effective device isolating interval $L_1$ measured before the formation of the second impurity diffusion region 200 is then reduced by $\Delta L$ compared to the effective device isolating interval $L_2$ measured after the formation of the second impurity diffusion region. This is true given that $\Delta L/2$ represents the length that the device isolating region is laterally eroded by one second impurity diffusion region, and that the impurity ions of both the two second impurity diffusion regions have the same lateral diffusion condition.

The reduction of the effective device isolating interval does not present a great a great problem in a relatively large device isolating region whose area is for example, about 0.8 µm as in a 16 Mb DRAM. However, in a small device isolating region whose area is for example, about 0.5 µm as in a 64 Mb DRAM, the reduction of the effective device isolating interval deteriorates the reliability of the device.

SUMMARY OF THE INVENTION

Therefore, it is an object of the present invention to provide a semiconductor device in which there is a formed contact hole in a manner resulting in a structure having high reliability and higher packing density.

The above object of the present invention is achieved by making a semiconductor device having contact holes formed in an interlayer insulator on impurity diffusion regions positioned on either side of an isolator such that the contact holes are not disposed along a shortest line distance across the isolator.

To accomplish the above object, according to the present invention there is provided a semiconductor device having contact holes selectively formed thereon comprising a semiconductor substrate, two first impurity diffusion regions of the semiconductor substrate which are positioned on either side of an isolator formed on the semiconductor substrate, an interlayer insulator having two contact holes formed on a portion of the two first impurity diffusion regions and the interlayer insulator being formed on the two first impurity diffusion regions and on the isolator, wherein the two contact holes are disposed to be offset such that no horizontal axis, defied as the shortest path across the insulator and travelling between the two first impurity diffusion regions, can be drawn connecting the centers of the two contact holes.

Additionally, according to the present invention, the semiconductor device is provided comprising a field oxide layer formed between a left-sided active region and a right-sided active region formed in at least part of the left-sided active region, a right-sided first impurity diffusion region formed in at least part of the right-sided active region, a first contact hole formed both in at least part of the left-sided first impurity diffusion region and adjacent to the field oxide layer, a left-sided second impurity diffusion region formed through the first contact hole, a second contact hole formed both in at least part of the right-sided first impurity diffusion region and adjacent to the field oxide layer, a right-sided second impurity diffusion region formed through the second contact hole, and a conductive layer which is formed in and around the first and second contact holes, and wherein the first and second contact holes are not disposed along a shortest line distance across the field oxide layer.

BRIEF DESCRIPTION OF THE DRAWINGS

The above objects and other advantages of the present invention will become more apparent by describing in detail a preferred embodiment of the present invention with reference to the attached drawings in which:

FIG. 1A illustrates a layout of a semiconductor device which shows a conventional method for forming a contact hole in a semiconductor device;

FIG. 1B is a cross section of the semiconductor device of FIG. 1A cut along line 1B—1B;

DETAILED DESCRIPTION OF THE PREFERRED EMBODIMENTS

Figure 2A:
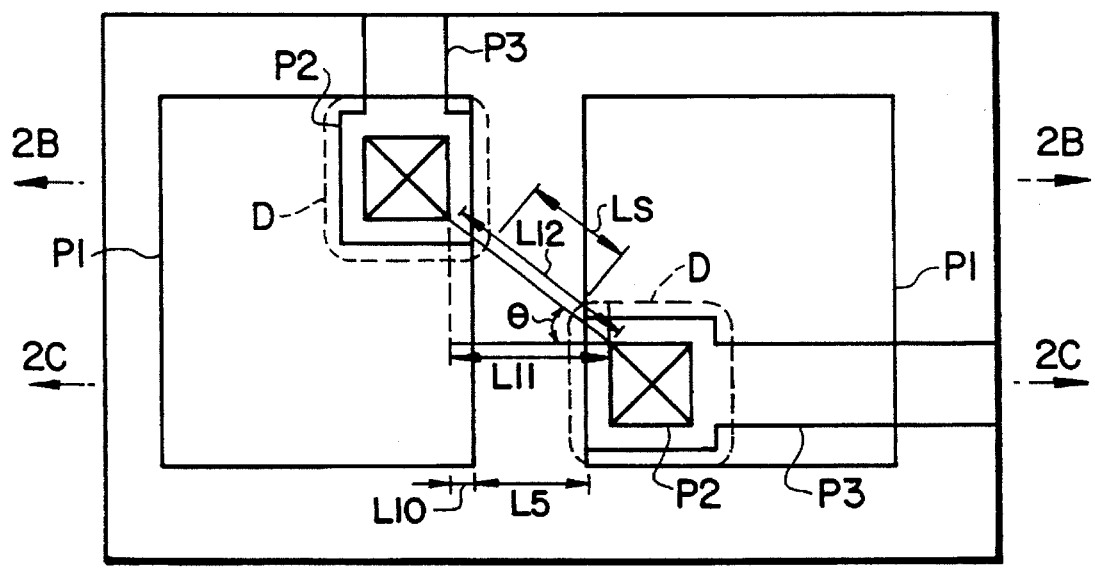
FIG. 2A illustrates a layout of a semiconductor device according to an embodiment of the present invention.

In the following figures now to be explained in greater detail, like reference numerals as those in FIGS. 1A and 1B are used to represent like components.

FIG. 2A shows a layout where mask patterns P2 forming contact holes are not located along a shortest line distance across a field oxide layer. $L_{12}$ represents a shortest distance between contact holes, $L_{10}$ represents the shortest distance from the contact hole (field oxide layer side) to the edge of the field oxide layer, and $\theta$ represents the angle between a shortest horizontal line distance connecting contact holes and a shortest distance across the field oxide layer.

In FIG. 2A, because shortest distance L between contact holes is lengthened by $$\frac{L11}{\cos\theta}(1-\cos\theta)$$

compared with the shortest distance $L_{11}$ of FIG. 1A, $L_s$ is increased proportionally.

Moreover, width $L_{OL}$ of FIG. 1A corresponding to a portion overlapped when the second impurity diffusion region formed in each active region is horizontally extended, is removed. It is desirable that while forming the second impurity diffusion regions, $L_s$ be as long as or longer than $L_5$.

In FIG. 2A, the shortest width of the field oxide layer can be below 2 µm, the shortest distance from the edge of the contact hole (field oxide layer side) to the field oxide layer can be below 1 µm, and the distance between the centers of the contact holes can be below 5 µm.

Figure 2B:
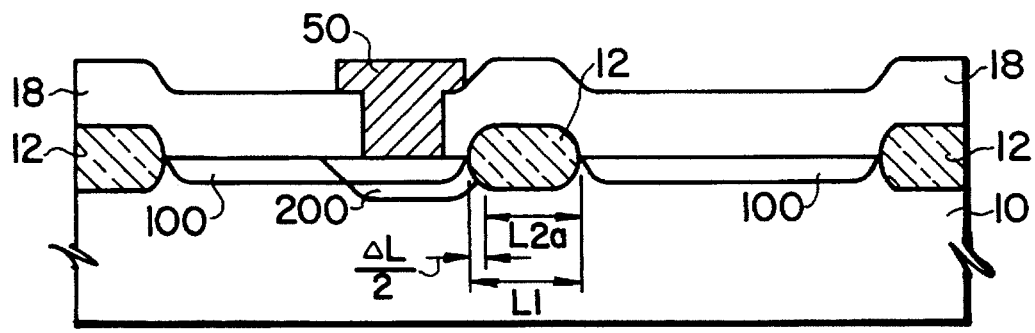
FIGS. 2B and 2C are cross sections of the semiconductor device of FIG. 2A cut along lines 2B—2B and 2C—2C, respectively.
Figure 2C:
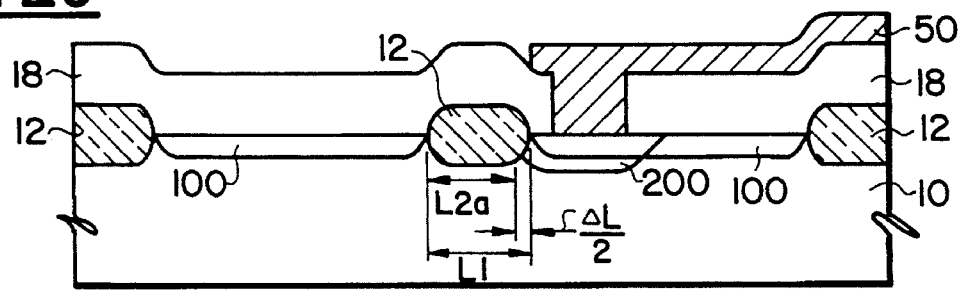

In FIGS. 2B and 2C, after the formation of the second impurity diffusion region 200, the effective device isolating interval $L_{2\alpha}$ is lengthened by $\Delta L/2$ compared with the effective device isolating interval $L_2$ of FIG. 1B. Because $\Delta L$ is usually about 0.15 µm when the depth of the second impurity diffusion region is about 2,000 Å to 5,000 Å, when forming a contact hole according to the present invention, as in a 64 Mb DRAM which has a device isolating region of about 0.5 µm, the effective device isolating interval can be lengthened up to about 0.43 µm as compared with the prior art (0.35 µm), thereby greatly lessening the probability of short-channel effects and punch-through.

The increased reliability results from not positioning contact holes along a shortest line path across field oxide layer 12, thus removing an overlapping portion $L_{OL}$ (shown in FIG. 1A) created when a second impurity diffusion region is horizontally extended.

Figure 3A:
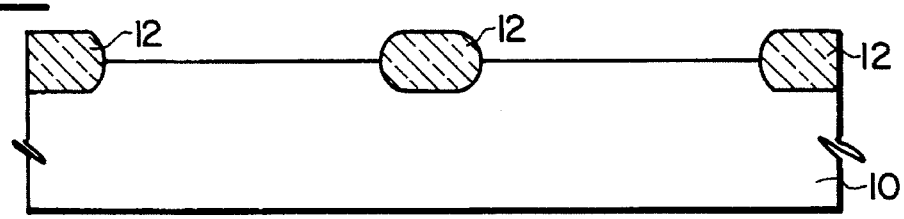
FIGS. 3A through 3D illustrate cross sections of the semiconductor device cut along line 2B—2B of FIG. 2A, for explaining the process of forming a contact hole according to the present invention.

FIG. 3A illustrates a process of forming field oxide layer 12 for dividing substrate 10 of a first conductivity type into a device isolating region and an active region. Field oxide layer 12 is formed using mask pattern P1 of FIG. 2A according to various methods, for example, the LOCOS method.

Figure 3B:
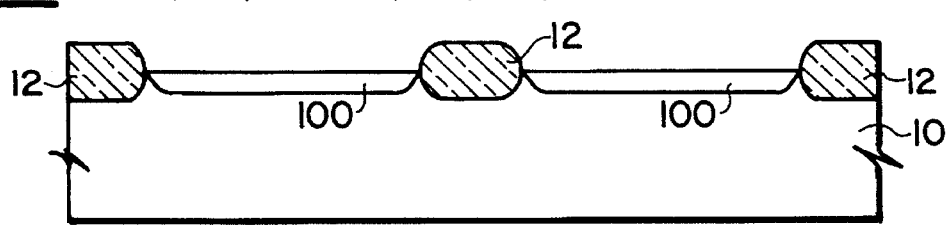

In FIG. 3B is shown the step of forming first impurity diffusion region 100. First impurity diffusion region 100 is formed by doping second conductivity-typed impurity ions 70 onto the whole surface of the resultant structure where field oxide layer 12 is previously formed.

It is desirable that first impurity diffusion region 100 have a depth of about 1,000 Å to 4,000 Å. It would be obvious for one of ordinary skill in the art that the fabricating order of such processes may be varied according to the device to be fabricated. For instance, in forming a MOS transistor, the process of doping impurity ions is performed after formation of a gate electrode.

Figure 3C:
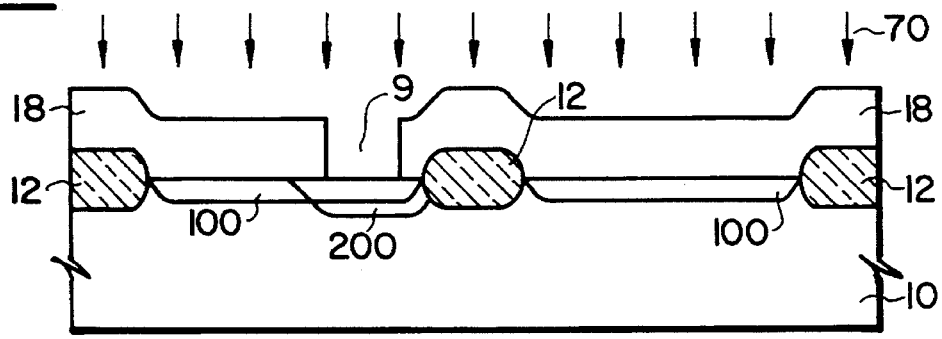

In FIG. 3C is illustrated the step of forming contact hole 9 and second impurity diffusion region 200. Interlayer insulator 18 is formed by coating insulating material to a certain thickness on the entire surface of substrate 10 where first impurity diffusion regions 100 are formed interleaving the field oxide layer 12. Contact hole 9 is then formed by partially etching interlayer insulator 18 using mask pattern P2 as shown in FIG. 2A. Subsequently, by re-doping second conductivity impurity ions 70 through contact holes 9, second impurity diffusion region 200 is formed so as to both reduce contact resistance between a conductive layer and the substrate, and to prevent operational failure of the device due to overetching of the substrate during formation of contact hole 9.

As shown in FIGS. 2A and 2C, contact hole 9 should be formed so as not to be located along the shortest line crossing the field oxide layer. Also, second impurity diffusion region 200 should have a higher impurity concentration and be deeper (for instance, 2,000 Å–5,000 Å) than the first impurity diffusion region 100. While doping impurity ions for forming the second impurity diffusion region 200, the second impurity diffusion region 200 is spread laterally by thermal energy supplied to the substrate.

Figure 3D:
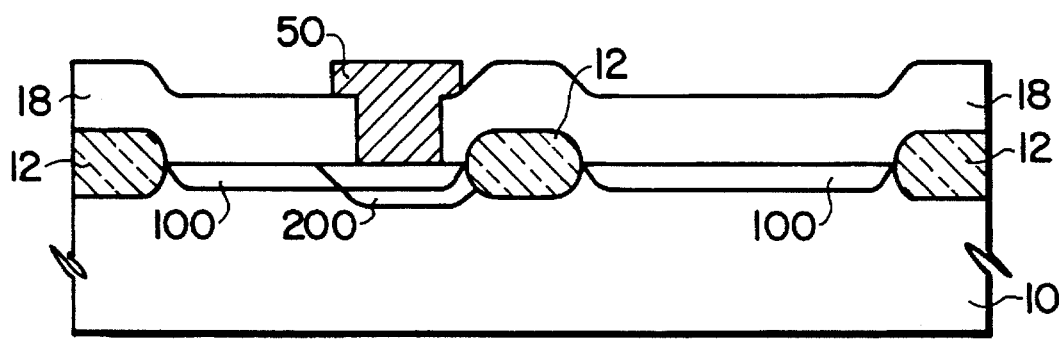

In FIG. 3D is shown a step for forming conductive layer 50. Contact hole 9 is filled with a conductive material such as polysilicon, silicide or polycide or by some combination thereof. The material is patterned using mask pattern P3 to complete the formation of conductive layer 50. The second impurity region 200 may be formed before the formation of the conductive layer as shown in FIG. 3C, or may be formed by doping second conductivity-typed impurity ions either during or after the formation of the conductive layer.

TABLE 1

| Field Oxide Layer Size | Breakdown Voltage Given Two Contact Holes | Breakdown Voltage Given One contact Hole | Breakdown Voltage Given No Contact Holes |
| --- | --- | --- | --- |
| 0.816 μm | 3.70 V | 4.84 V | 6.68 V |
| 0.748 μm | 6.82 V | 8.09 V | 10.4 V |
| 0.68 μm | 9.90 V | 11.20 V | 13.60 V |

TABLE 1 above illustrates test results showing the variation of breakdown voltage according to the size of field oxide layer and over various numbers of contact holes, i.e., when one contact hole is formed on both sides of a field oxide layer, when one contact hole is formed on one side only, and when no contact holes are formed. The breakdown voltage when one contact hole is formed on one side is far larger than that when two contact holes are formed.

Figure 4:
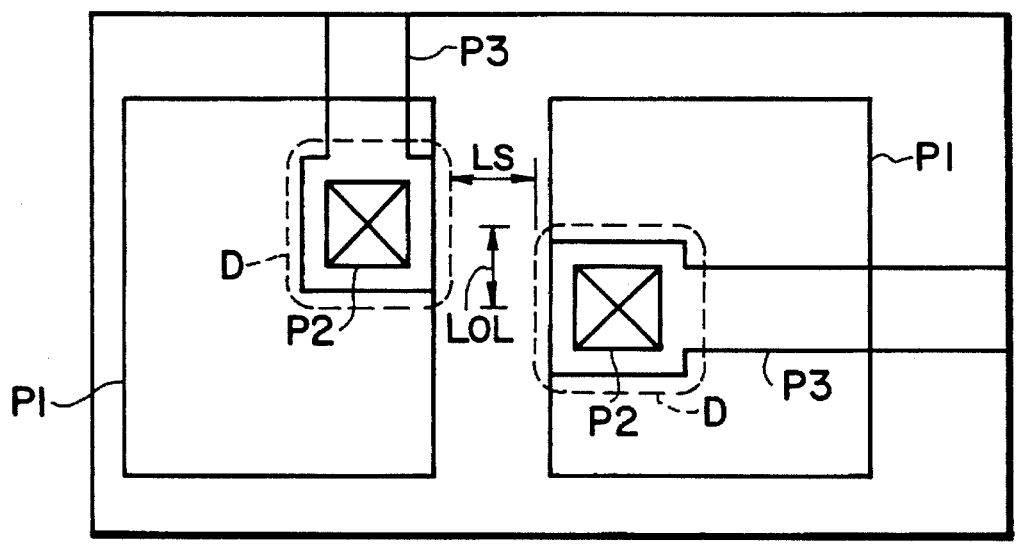
FIG. 4 illustrates a layout of a semiconductor device according to another embodiment of the present invention.

In FIG. 4, another embodiment of the present invention is illustrated wherein a portion which constitutes an overlapped dimension $L_{OL}$ is created when second impurity diffusion regions are extended horizontally. The structure of FIG. 2A provides no overlapped portion.

Overlapped portion $L_{Ol}$ of FIG. 4 is smaller than that in the prior art (in comparison, supposing $L_{OL}$ of FIG. 1A is 10 units, then $L_{OL}$ of FIG. 4 would be 5 units), thereby reducing the probability of a short-channel effect and punch-through and ensuring process margin as compared with the prior art.

Figure 5A:
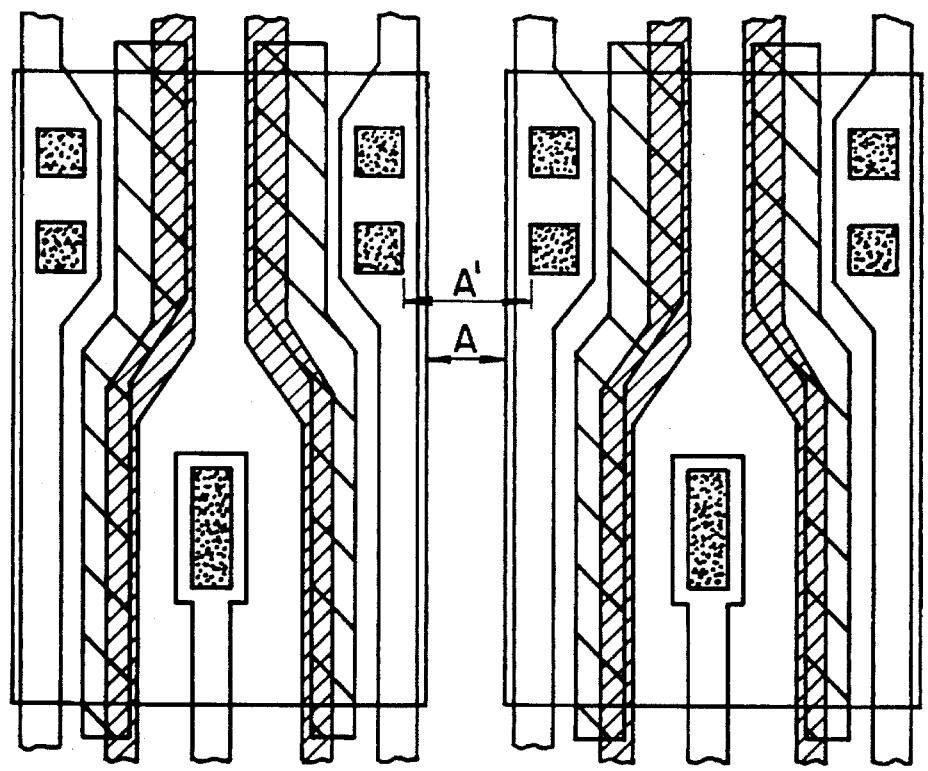
FIG. 5A illustrates a partial layout of sense amplifiers of a semiconductor device manufactured according to the conventional method; and, FIG. 5B illustrates a partial layout of sense amplifiers of a semiconductor device manufactured according to the present invention.
Figure 5B:
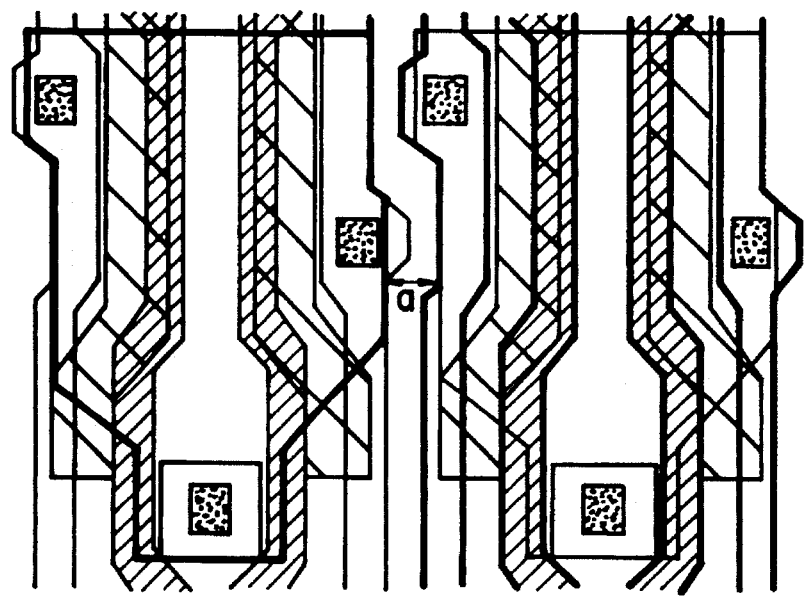

FIGS. 5A and 5B illustrate partial layouts of sense amplifiers of the semiconductor devices manufactured by the prior art and the present invention, respectively.

If the shortest path A crossing the field oxide layer in FIG. 5A is said to the 10 units and the shortest distance between contact holes A' which crosses the field oxide layer is said to be 16 units, then even if the shortest distance A across the field oxide layer of FIG. 5B is reduced to 8 units, the shortest distance between the contact holes in FIG. 5B does not change. Thus, the circuit of the present invention realizes higher density along with improved reliability over the prior art semiconductor devices.

As described above in detail, the method for forming contact hole 9 in a semiconductor device according to the present invention is capable of expanding the effective device isolating interval by not disposing the contact holes along the shortest line crossing an isolator, thereby realizing higher density of a semiconductor device and improved reliability.

Although a field oxide layer is used as the isolator in the aforementioned embodiments, any material layer which has impurity diffusion regions on both sides thereof may be used as an isolator.

While the invention has been described in connection with what is presently considered to be the most practical and preferred embodiments, it is to be understood that the invention is not limited to the disclosed embodiments, but, on the contrary, is intended to cover various modifications and equivalent arrangements included within the spirit and scope of the appended claims.

What is claimed is:

1. A semiconductor device having contact holes selectively formed thereon comprising:

a semiconductor substrate;

two first impurity diffusion regions of said semiconductor substrate which are positioned on either side of an isolator formed on said semiconductor substrate; and an interlayer insulator having two contact holes formed on a portion of said two first impurity diffusion regions and said interlayer insulator being formed on said two first impurity diffusion regions and on said isolator, wherein said two contact holes are disposed to be offset such that no horizontal axis, defined as the shortest path across the isolator and travelling between the two first impurity diffusion regions, can be drawn connecting the centers of said first and second contact holes, wherein a longest distance across the isolator is below 2 μm, a longest distance between an edge of a contact hole nearest said isolator and said isolator is below 1 μm, and a longest distance between centers of said contact holes is below 5 μm.

2. The semiconductor device of claim 1, wherein said semiconductor substrate is of a first conductivity type and said impurity diffusion regions formed therein are of a second conductivity type.

3. The semiconductor device of claim 2, further comprising two second impurity diffusion regions formed by doping, through said corresponding contact holes, second conductivity type impurity ions into said first impurity diffusion regions, respectively.

4. The semiconductor device of claim 3, wherein said second impurity diffusion regions are formed deeper in said substrate than the corresponding first impurity diffusion regions.

5. The semiconductor device of claim 1, wherein said isolator is a field oxide layer defining an active region and a device isolating region on said semiconductor substrate.

6. The semiconductor device of claim 1, wherein said isolator is a gate electrode of a MOS transistor.

7. The semiconductor device of claim 3, wherein a minimum distance between said two second impurity diffusion regions is at least as long as a minimum width of said isolator.

8. The semiconductor device of claim 4, wherein a depth of said two first impurity diffusion regions in said substrate is between about 1000 Å and 4000 Å, and a depth of said two second impurity diffusion regions is between about 2000 Å and 5000 Å.

9. A semiconductor device having contact holes selectively formed thereon comprising:

a semiconductor substrate;

two first impurity diffusion regions of said semiconductor substrate which are positioned on either side of an isolator formed on said semiconductor substrate, wherein said two first impurity regions are a source region and a drain region, respectively, of a MOS transistor; and an interlayer insulator having two contact holes formed on a portion of said two first impurity diffusion regions and said interlayer insulator being formed on said two first impurity diffusion regions and on said isolator, wherein said two contact holes are disposed to be offset such that no horizontal axis, defined as the shortest path across the isolator and travelling between the two first impurity diffusion regions, can be drawn connecting the centers of said first and second contact holes, wherein a longest distance across the isolator is below 2 μm, a longest distance between an edge of a contact hole nearest said isolator and said isolator is below 1 μm, and a longest distance between centers of said contact holes is below 5 μm.

10. The semiconductor device of claim 9, wherein said isolator is a field oxide layer defining an active region and a device isolating region on said substrate.

11. The semiconductor device of claim 9, wherein said isolator is a gate electrode in said MOS transistor.

12. The semiconductor device of claim 9, wherein said semiconductor substrate is of a first conductivity type and said first impurity diffusion regions formed therein are of a second conductivity type.

13. The semiconductor device of claim 12, further comprising two second impurity-doped diffusion regions formed by doping second conductivity type impurity ions into said first impurity diffusion regions through said corresponding contact holes.

14. The semiconductor device of claim 13, wherein said second impurity diffusion regions extend deeper into said substrate than corresponding said first impurity diffusion regions.

15. The semiconductor device of claim 9, wherein a minimum distance between said two second impurity diffusion regions is at least as long as a minimum width of said isolator.

16. The semiconductor device of claim 14, wherein a depth of said two first impurity diffusion regions in said substrate is between about 1000 Å and 4000 Å, and a depth of said two second impurity diffusion regions is between about 2000 Å and 5000 Å.

* * * * *